(12) United States Patent
Penketh

(10) Patent No.: US 6,680,546 B1
(45) Date of Patent: Jan. 20, 2004

(54) ELECTRICAL CIRCUITS

(75) Inventor: David Michael Penketh, Staffordshire (GB)

(73) Assignee: TRW LucasVarity Electric Steering Ltd., West Midlands (GB)

( * ) Notice: Subject to any disclaimer, the term of this patent is extended or adjusted under 35 U.S.C. 154(b) by 0 days.

(21) Appl. No.: 09/576,400

(22) Filed: May 22, 2000

(30) Foreign Application Priority Data

May 22, 1999 (GB) .............................................. 9911905

(51) Int. Cl.[7] ................................................ H02G 3/00
(52) U.S. Cl. ........................ 307/9.1; 307/10.1; 307/10.6
(58) Field of Search ................................ 307/9.1, 10.1, 307/10.6; 174/33, 36, 52.1, 59, 98, 99 B, 126.1, 154; 361/601, 637, 658, 719, 748, 823; 257/724, 532

(56) References Cited

U.S. PATENT DOCUMENTS

| | | | |
|---|---|---|---|
| 5,101,322 A | | 3/1992 | Ghaem et al. |
| 5,107,233 A | * | 4/1992 | Stoft ........................... 333/168 |
| 5,386,346 A | * | 1/1995 | Gleadall ..................... 361/799 |
| 5,391,919 A | * | 2/1995 | Torti et al. ................... 257/690 |
| 5,602,451 A | | 2/1997 | Kohge et al. |
| 5,699,235 A | * | 12/1997 | Tsurumiya et al. ......... 361/803 |
| 5,729,053 A | * | 3/1998 | Orthmann .................... 257/724 |
| 5,847,951 A | * | 12/1998 | Brown et al. ................ 363/147 |

FOREIGN PATENT DOCUMENTS

| | | | | |
|---|---|---|---|---|
| DE | 3630830 A1 | | 3/1988 | |
| EP | 0546731 A1 | * | 6/1993 | ......... H01L/23/495 |
| EP | 0 546 731 A1 | * | 6/1993 | ......... H01L/23/495 |
| JP | 6-21323 | * | 1/1994 | ........... H01L/23/62 |
| JP | 10303522 | | 11/1998 | |
| JP | 11225459 | | 8/1999 | |

OTHER PUBLICATIONS

Research Disclosure 2266 (2000) Jan., Emsworth, GB, XP 0009976444, pp. 134–135, 429115, "Design for Decoupling Capacitors on Burn–in Board".

* cited by examiner

Primary Examiner—Gregory J. Toatley, Jr.
Assistant Examiner—Robert L DeBeradinis
(74) Attorney, Agent, or Firm—Torolli, Sundheim, Covell & Tummino L.L.P.

(57) ABSTRACT

An electrical circuit is disclosed having a drive stage and a control stage suitable, for example, for operating an electric motor in an electrical power assisted steering system. The circuit comprises a drive stage (1) comprising at least a first conducting means and a control stage (2) comprising a second conducting means, the first conducting means comprising one or more conductive tracks or links (3) adapted to define an electrical circuit with an input terminal (7) extending from an end portion of at least one track for connection to a source of electrical current, the second conducting means (2) comprising a printed circuit board (4) defining tracks adapted to carry current to/from one or more control devices and supporting at least one track connected to a surface mounted de-coupling capacitor (9) supported by the printed circuit board (4), and in which a portion of the track of the first conducting means (1) is so constructed and arranged as to provide an electrical connection between the capacitor (9) and the terminal (7).

10 Claims, 2 Drawing Sheets

ELECTRICAL CIRCUITS

This invention relates to improvements in electrical circuits, especially but not exclusively which include a drive stage and a control stage for powering and controlling electrical motors such as those found in electrical power assisted steering systems. In one aspect it relates in particular to an improved drive and control circuit for an electric motor in an electric power assisted steering system.

Alternatively, the invention could be applied to any circuit arranged to switch relatively high loads such as heating elements or other power actuators.

One particular application of an electrical circuit is in the field of electric power assisted steering systems. It is now well known to provide an electric motor in a steering system in order to supply an assistance torque to a steering shaft. The motor typically comprises a number of windings connected to form one or more phases. Current is supplied to each phase by one or more switching devices connected by conductive tracks defining a high power drive circuit. Due to the high currents which can flow in the windings, the drive circuit is typically required to have a high power rating, necessitating bulky electrical conductive tracks between the windings and associated switching devices.

The operation of the switching devices is controlled by a low power control circuit. As this only needs to carry lower currents, such as digital or analogue switching signals, it can comprise narrower or smaller gauge conductive tracks between components than the drive circuit.

Finally, it is necessary to connect the electrical circuit, comprising both control and drive circuits to a source of current such as a battery. Conveniently, this can be achieved by direct connection to one or more terminals provided on the end of respective tracks of the drive circuit.

Such drive control circuits have many applications beyond electric power steering systems. Any component, such as a motor or heating element, which requires a switched current supply has similar requirements for both low current and high current flow in order to make it function.

It has been proposed in our earlier application GB 9824590.5 to provide a leadframe comprising a plurality of copper frets or tracks embedded in a plastics material to provide a conductive structure which interconnects the various electrical components of the drive circuit. These include the switching devices for directing current from the battery to the desired windings, input terminals for connecting to the battery, and output terminals for connecting the frets to the windings. The control circuit is then provided on a low power printed circuit board and this is connected to the leadframe at various points as required. Since the control circuit includes only components with a low current drain, such as control devices for providing switching signals to the switching devices, a low cost printed circuit board can be used.

To ensure reliable operation of the control circuitry and drive circuitry, it is necessary to de-couple the input terminals by providing a capacitor which connects the terminals to an earthen chassis medium. This is typically an aluminium casting and the capacitor may comprise a leaded axial ceramic capacitor. A lead at one end of the capacitor may be soldered directly to the input terminal with the other lead connected directly to the chassis via a metal insert bush and screw.

The use of leaded capacitors is, however, far from ideal. The leads of the capacitor introduce parasitic inductance which reduces the effectiveness of the capacitor to decouple RFI.

The problem could be alleviated by soldering a surface mount capacitor directly to the terminal of the leadframe. However, the mounting of such a capacitor in this manner is difficult due to its small physical size and inherent mismatch in thermal expansion co-efficient between the fretwork of the leadframe and the capacitor which could ultimately lead to damaging the capacitor.

According to a first aspect, the invention provides an electrical circuit which comprises: a drive stage comprising at least a first conducting means and a control stage comprising a second conducting means, the first conducting means comprising one or more conductive tracks or links adapted to define an electrical circuit with an input terminal extending from an end portion of at least one track for connection to a source of electrical current, the second conducting means comprising a printed circuit board defining tracks adapted to carry current to/from one or more control devices and supporting at least one track connected to a surface mounted de-coupling capacitor supported by the printed circuit board, and in which a portion of the track of the first conducting means is so constructed and arranged as to provide an electrical connection between the capacitor and the terminal.

By arranging for the track from the terminal to connect to the capacitor on the pcb, parasitic losses are minimised when coupling to the capacitor. Furthermore, by mounting the de-coupling capacitor on the same pcb as the low power control circuitry it is possible to simply connect a surface mount device which could not be connected directly to the first conducting means.

Preferably, the first conducting means comprises a lead frame comprising a plurality of conductive tracks encapsulated in a non-conducting plastic material. The leadframe may be substantially planar and the portion of track between the capacitor and the terminal may be upstanding from the leadframe to connect to the pcb.

The conducting tracks of the leadframe may have a higher power rating than the conducting tracks of the second conducting means.

Preferably, the capacitor is connected at one side to the track on the pcb which is connected to the track on the leadframe. The other side of the capacitor may be connected to a further track on the pcb. This may in turn be earthed to a chassis through a conductive fastener, such as a bolt. The connection may be soldered.

It is most preferred that the terminal is defined by an end portion of the track in the leadframe. The leadframe may comprise tracks encapsulated in plastic which may be so constructed and arranged as to form a non-conductive shroud around the terminal.

The portion of the track adjacent the terminal may be severed and each severed end displaced out of the plane of the leadframe towards the second conducting means. These ends may pass through openings in the second conducting means to contact the conducting track for the capacitor. They may then be soldered to the track to electrically connect to the capacitor.

In an alternative, instead of severing the track it may be continuous with an arch formed in the track. The top of the arched portion of the track may pass through the pcb to connect to the capacitor. Thus, the capacitor connects to the terminal down one side of the arch. Other spatial arrangements of the track are also envisaged which fall within the scope of the invention.

In accordance with a second aspect, the invention provides an electrical power assisted steering system including an electric motor and a drive and control circuit for the electric motor in accordance with the first aspect of the invention.

According to a third aspect, the invention provides an electrical circuit which comprises a low current stage and a high current stage, the low current stage comprising at least a second conducting means, the first conducting means comprising one or more conductive tracks or links adapted to define an electrical circuit with an input terminal extending from an end portion of at least one track for connection to a source of electrical current, the second conducting means comprising a printed circuit board defining tracks adapted to carry current to/from one or more control devices and supporting at least one track connected to a surface mounted de-coupling capacitor supported by the printed circuit board, and in which a portion of the track of the first conducting means is so constructed and arranged as to provide an electrical connection between the capacitor and the terminal.

There will now be described, by way of example only, two embodiments of the present invention with reference to the accompanying drawings of which:

Figure 1:
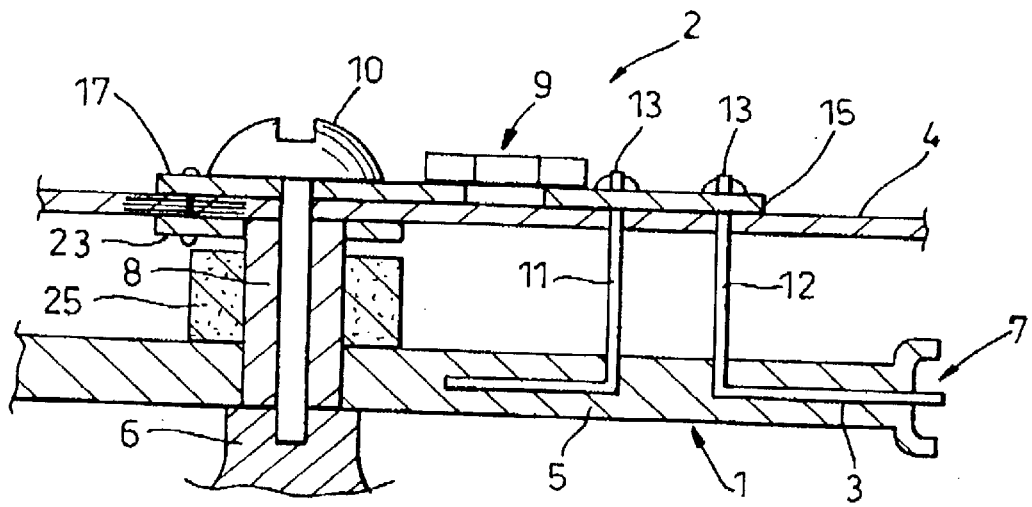
FIG. 1 is a partial cross-sectional view of a drive and control circuit in accordance with a first embodiment of the present invention.

The electrical circuit shown in the accompanying FIG. 1 forms a part of an electrical power assisted steering system that includes a motor which is operated by a motor drive and control circuit. The circuit is divided into two distinct sections. A first section 1 defines a motor drive stage and comprises a leadframe of heavy gauge copper tracks or frets 3 encapsulated in a plastics material 5. A terminal 7 is defined on an end of one of the tracks in the leadframe for connection to a source of electric current (not shown) such as a car battery or other part of a vehicle wiring harness. As this terminal 7 carries high levels of current from the source to the motor it is necessarily of a heavy gauge, having a relatively large cross-sectional area to prevent overheating. To eliminate joints, the terminal 7 is simply defined by an extension of the end of a track of the leadframe which extends in the plane of the leadframe. The track is also necessarily of a relatively heavy gauge. In practice, several such terminals may be provided.

The second stage 2 is a control stage which comprises a printed circuit board (pcb) 4 upon which low power control components are provided. In particular, this supports the control devices (not shown) which control high power switching devices supported by the drive circuit leadframe.

Both the leadframe and pcb are planar and are supported on a chassis member 6 with the pcb 4 overlaying the leadframe. The pcb 4 is separated from the chassis 6 by a number of spacers or an insulating sleeve 25. A respective bolt 10 passes through the pcb 4, a spacer 8 and leadframe to hold the two stages to the chassis member 6.

In order to decouple the terminal 7 for RFI suppression, a ceramic capacitor 9 is connected between the terminal 7 and the chassis 6 through one of the bolts 10 in the manner shown in FIG. 1. The chassis 6 is made of aluminium and acts as an earth.

A portion of the track in the leadframe from which the terminal 7 extends is severed close to the terminal 7 to define two severed ends 11, 12. Each of the severed ends 11, 12 is displaced so as to be upstanding from the plane of the leadframe and is formed into prongs 13 (one at each corner). The prongs 13 pass through respective openings in the pcb 4.

A substantially square copper conducting patch or track 15 is formed on the upper face of the pcb 4 encompassing the four prongs 13, and the prongs 13 are soldered onto the patch 15 to form a secure electrical and mechanical connection between patch and prongs.

Figure 2:
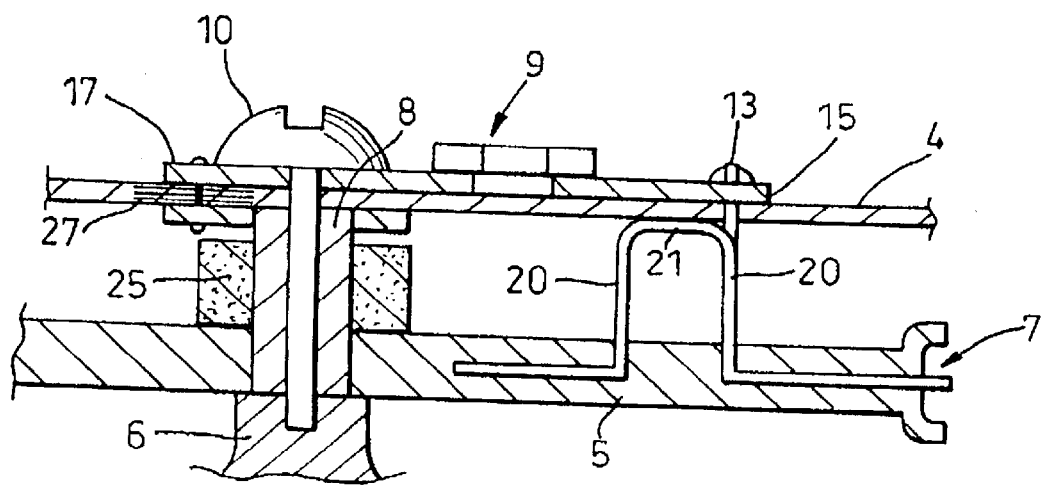
FIG. 2 is a view similar to that of FIG. 1 for a second embodiment in accordance with the present invention.
Figure 3:
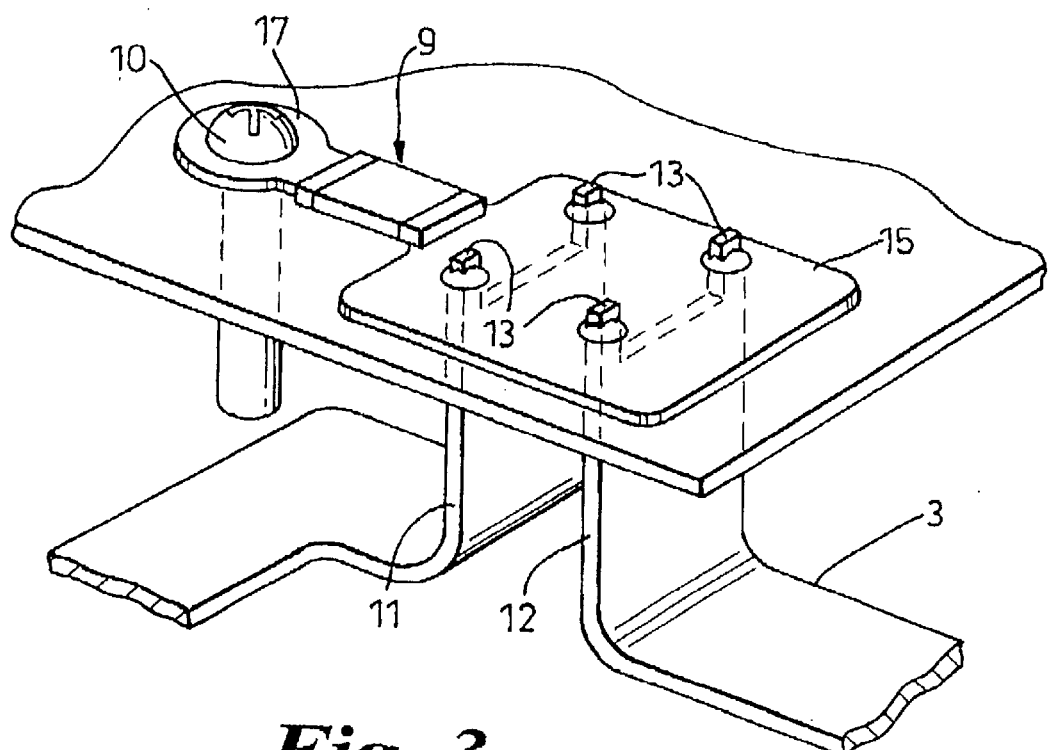
FIG. 3 is an isometric view of the arrangement of FIG. 1.

The ceramic surface mount type (SMT) de-coupling capacitor 9 is soldered or glued to the upper surface of the pcb 4 with one end in electrical contact with the patch 15. The other end of the capacitor 9 is in contact with a second, substantially circular, patch 17 of conducting material provided on the surface of the pcb 4 around a bolt-receiving hole. A conducting bolt 10 passes through the hole to secure the pcb to the chassis in order to electrically connect the circular patch 17 to the chassis 6. Vias 27 are provided from the patch 17 through the pcb to a circular conductive washer 23 provided on the underside of the pcb. This washer is in contact with a conductive sleeve that fits around the shaft of the bolt 14 to connect to the chassis. As shown in FIGS. 1 and 2, a number of patches 17 may connect to the chassis with some of the patches being provided on the pcb as intermediate layers below the surface. Two or perhaps three or more such conductive layers may be provided. Finally, an insulating sleeve 25 is provided around the conductive sleeve 8.

Figure 4:
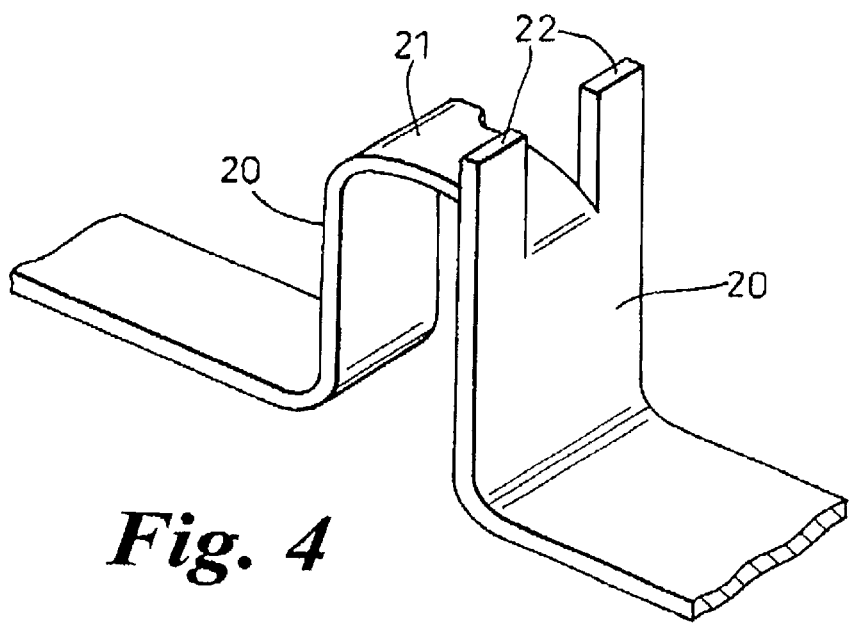
FIG. 4 is an isometric view which shows the alternative fret arrangement of the second embodiment.

In an alternative, shown in FIGS. 2 and 4 of the accompanying drawings, the portion of track adjacent the terminal 7 is not severed but is displaced upwards from the plane of the leadframe to form an arch with vertical sides 20 and a substantially horizontal top 21.

Two slits are made in the horizontal portion of the arch. Each slit starts at one edge adjacent the junction of the top and one side wall and extends first inwardly and then parallel to the edge towards the junction of the top portion and the other side wall. In this manner, two prongs 22 are formed which are deformed upwardly. The prongs 22 again pass through openings in the pcb 4 to contact a conducting patch 15 as for the first embodiment.

Since the heavy gauge tracks are directly soldered to the patch 15 on the pcb, RFI decoupling is optimised. Additionally mounting the capacitor directly to a pcb which is additionally used to support the control circuitry simplifier construction and speeds up the assembly process.

What is claimed is:

1. An electrical circuit which comprises: a drive stage comprising at least a first conducting means and a control stage comprising a second conducting means, said first conducting means comprising one or more conductive tracks or links which define an electrical circuit with an end portion of at least one of said tracks having an input terminal extending therefrom for connection to a source of electrical current, said second conducting means comprising a printed circuit board defining tracks which carry current to/from one or more control devices and supporting at least one track connected to a surface mounted de-coupling capacitor supported by said printed circuit board, and wherein a portion of said track of said first conducting means provides an electrical connection between said capacitor and said terminal.

2. An electrical circuit according to claim 1 wherein said first conducting means comprises a lead frame comprising a plurality of conductive tracks encapsulated in a non-conducting plastic material.

3. An electrical circuit according to claim 2 wherein said leadframe is substantially planar and said portion of track between said capacitor and said terminal is upstanding from said leadframe to connect to said printed circuit board.

4. An electrical circuit according to claim 2 wherein said conducting tracks of said leadframe have a higher power rating than said conducting tracks of said second conducting means.

5. An electrical circuit according to claim 1 wherein said capacitor is connected at one side to said track on said printed circuit board which is connected to said track on said first conducting means and said other side of said capacitor is connected to a further track on said printed circuit board.

6. An electrical circuit according to claim 5 wherein said further track is earthed to a chassis through a conductive fastener, such as a bolt.

7. An electrical circuit according to claim 3 wherein said portion of said track adjacent said terminal is severed to form two severed end portions, and wherein each severed end portion is displaced outwards from said planar leadframe towards said second conducting means.

8. An electrical circuit according to claim 7 wherein said severed end portions pass through openings in said second conducting means to contact said conducting track for said capacitor.

9. An electrical circuit according to claim 1 wherein said portion of track adjacent said terminal is continuous with an arch formed in said track.

10. An electrical circuit which comprises a low current stage and a high current stage, said high current stage comprising at least a first conducting means and said low current stage comprising at least a second conducting means, said first conducting means comprising one or more conductive tracks or links which define an electrical circuit with an input terminal extending from an end portion of at least one track for connection to a source of electrical current, said second conducting means comprising a printed circuit board defining tracks which carry current to/from one or more control devices and supporting at least one track connected to a surface mounted decoupling capacitor supported by said printed circuit board, and in which a portion of said track of said first conducting means provides an electrical connection between said capacitor and said terminal.

* * * * *